(12) United States Patent
Wu et al.

(10) Patent No.: US 7,060,560 B2
(45) Date of Patent: *Jun. 13, 2006

(54) METHOD OF MANUFACTURING NON-VOLATILE MEMORY CELL

(75) Inventors: Sheng Wu, Hsinchu (TW); Da Sung, Hsinchu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 10/711,511

(22) Filed: Sep. 23, 2004

(65) Prior Publication Data

US 2005/0233523 A1    Oct. 20, 2005

(30) Foreign Application Priority Data

Apr. 16, 2004    (TW) ................................ 93110637 A

(51) Int. Cl.
*H01L 21/336* (2006.01)
(52) U.S. Cl. ...................... 438/257; 438/259; 438/263
(58) Field of Classification Search ......... 438/257–267
See application file for complete search history.

(56) References Cited

U.S. PATENT DOCUMENTS

| | | | | |
|---|---|---|---|---|
| 6,249,022 | B1 * | 6/2001 | Lin et al. ..................... | 257/324 |
| 6,635,533 | B1 * | 10/2003 | Chang et al. ............... | 438/259 |
| 2004/0207007 | A1 * | 10/2004 | Lin et al. ..................... | 257/316 |

* cited by examiner

*Primary Examiner*—H. Jey Tsai
(74) *Attorney, Agent, or Firm*—Jiang Chyun IP Office

(57) ABSTRACT

A method of manufacturing a non-volatile memory cell includes forming a first dielectric layer on a substrate. A second dielectric layer having a trench is formed on the first dielectric layer. Thereafter, a pair of charge storage spacers is formed on sidewalls of the trench. A third dielectric layer is then formed over the substrate to cover the first dielectric layer, the charge storage spacers and second dielectric layer. A conductive structure is formed on the third dielectric layer over the charge storage spacers. Subsequently, portions of the third dielectric layer, the second dielectric layer and first dielectric layer not covered by the conductive structure are removed. Ultimately, source/drain regions are formed in the substrate at each side of the conductive structure.

15 Claims, 7 Drawing Sheets

METHOD OF MANUFACTURING NON-VOLATILE MEMORY CELL

CROSS-REFERENCE TO RELATED APPLICATION

This application claims the priority benefit of Taiwan application serial no. 93110637, filed Apr. 16, 2004.

BACKGROUND OF THE INVENTION

1. Field of Invention

The present invention relates to a method of manufacturing a non-volatile memory cell. More particularly, the present invention relates to a method of manufacturing a single-cell with two bits type of non-volatile memory cell, which is applicable to a flash memory cell and a silicon-oxide-nitride-oxide-silicon (SONOS) memory cell.

2. Description of Related Art

Recently, the demands on non-volatile memory devices increase with due to the popularity of portable electronic products. Because of the maturity of flash memory manufacturing techniques and the demands of portable electronic products, memory cell array and memory cells thereof having high storage density and high storage capacity become very important.

Generally, a flash memory is manufactured by forming a tunneling oxide layer, a conductive layer and a dielectric layer sequentially. Then, the layers mentioned above are defined to form a floating gate and an inter-gate dielectric layer. Thereafter, a control gate is formed on the inter-gate dielectric layer over the floating gate.

However, when defects are present in the tunneling oxide layer underneath the polysilicon-floating gate, the reliability of devices is affected by the leakage current resulted from the defects. To resolve the leakage current issue of the devices, a charge-trapping layer is used to replace the polysilicon-floating gate. Since the charge-trapping layer is a silicon nitride layer, the non-volatile memory formed by oxide-nitride-oxide (ONO) is known as a SONOS memory.

Due to the charge trapping function of the silicon nitride layer, electrons injected into the silicon nitride layer are not distributed uniformly therein, i.e. the electrons are only localized at a certain area of the silicon nitride layer. Therefore, when a SONOS memory is programmed, electrons are locally stored at the channel region over the source/drain region. In the memory mentioned above, four storage states can be written in a memory cell by varying voltages applied to the gate and the source/drain region. In other words, in this type of flash memory, two bits are stored in one cell.

When programming such a SONOS memory, hot electrons injected into the charge-trapping layer are distributed according to the injection energy. However, with the trends of high integration, data with two bits stored in the same memory cell will influence each other so as to cause a programming error. Therefore, the reliability of the memory is affected significantly.

SUMMARY OF THE INVENTION

The invention provides a method of manufacturing a non-volatile memory cell to simplify processes and reduce the cell size of a single-cell with two bits type flash memory.

The invention provides a method of manufacturing a flash memory cell to maintain the space occupied by a single-cell with two bits type of memory cell of the present invention to be about the same as that of a conventional memory cell. Therefore, the costs of technical development and equipment investment are reduced.

The invention provides a method of manufacturing a SONOS memory cell to prevent a programming error caused by electrons transferring from one side to the other side in the charge-trapping layer.

As embodied and broadly described herein, the invention provides a method of manufacturing a non-volatile memory cell includes forming a first dielectric layer on a substrate. Then, a second dielectric layer having a trench is formed on the first dielectric layer. Thereafter, a plurality of charge storage spacers is formed on sidewalls of the trench. A third dielectric layer is then formed over the substrate to cover the first dielectric layer, the charge storage spacers and the second dielectric layer. A conductive structure is further formed on the third dielectric layer over the charge storage spacers. Subsequently, portions of the third dielectric layer, the second dielectric layer and first dielectric layer not covered by the conductive structure are removed. Ultimately, a source/drain region is then formed in the substrate at each side of the conductive structure.

As embodied and broadly described herein, the invention provides a method of manufacturing a flash memory cell, including forming a tunneling dielectric layer over a substrate. A patterned dielectric layer having a trench is formed over the tunneling dielectric layer. Thereafter, a conductive layer is formed over the substrate to cover the trench. Portions of the conductive layer are removed to form a pair of conductive spacers on the sidewalls of the trench. An inter-gate dielectric layer is formed over the substrate to cover the patterned dielectric layer, the pair of the conductive spacers and the tunneling dielectric layer. Thereafter, a control gate is formed on the inter-gate dielectric layer over the conductive spacers. Ultimately, a source/drain region is formed in the substrate at each side of the control gate.

As embodied and broadly described herein, the invention provides a method of manufacturing a silicon-oxide-nitride-oxide-silicon (SONOS) memory cell, including forming a pad oxide layer over a substrate. A patterned dielectric layer having a trench is formed over the pad oxide layer. Thereafter, a charge-trapping layer is formed over the substrate to cover the trench. Portions of the charge-trapping layer are removed to form a pair of charge-trapping spacers on sidewalls of the trench. A top oxide layer is formed over the substrate to cover the patterned dielectric layer, the pair of the charge-trapping spacers and the pad oxide layer. Thereafter, a gate is formed on the top oxide layer over the charge-trapping spacers. Ultimately, a source/drain region is formed in the substrate at each side of the gate.

In the present invention, since two charge storage structure, such as charge storage spacer, is formed in one memory cell, the manufacturing process is simplified and an area occupied by that one memory cell is reduced. The present invention is applied to the manufacturing of non-volatile memory cells, such as flash memory cells or SONOS memory cells to prevent a programming error caused by the electrons trapped at one end of a charge-trapping layer of a SONOS memory cell and extended to the other side. Therefore, reliability of memory devices can be improved and miniaturization of the SONOS memory cell is practicable. The single-cell with two bits type of memory cell of the present invention and the conventional memory cell are identical in size. Furthermore, the memory cell of the present invention can be manufactured by using the existing equipment and technique, and the costs of technical development and equipment investment are thereby reduced.

One or part or all of these and other features and advantages of the present invention will become readily apparent to those skilled in this art from the following description wherein there is shown and described a preferred embodiment of this invention, simply by way of illustration of one of the modes best suited to carry out the invention. As it will be realized, the invention is capable of different embodiments, and its several details are capable of modifications in various, obvious aspects all without departing from the invention. Accordingly, the drawings and descriptions will be regarded as illustrative in nature and not as restrictive.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

The concept of the present invention is to form charge storage spacers as a charge storage structure. The embodiments illustrated below are examples of the manufacturing process of various non-volatile memory cells. The embodiments illustrated do not limit the scope of the present invention.

FIG. 1A~FIG. 1D are schematic top views of a portion of a flash memory cell showing the steps for fabricating a flash memory according to the first embodiment of the present invention; and FIG. 2A~FIG. 2F are schematic cross-sectional views of a portion of a flash memory cell showing the steps for fabricating a flash memory according to the first embodiment.

Figure 1A:
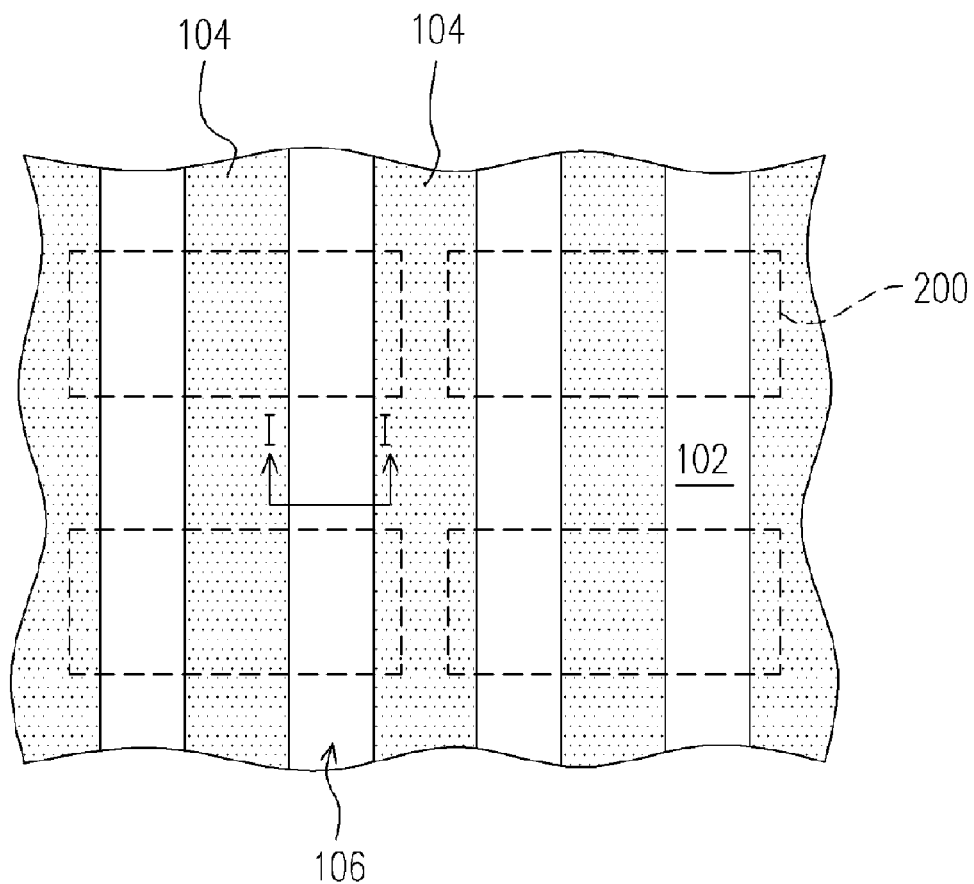
FIG. 1A~FIG. 1D are schematic top views of a portion of a flash memory cell showing the steps for fabricating a flash memory according to the first embodiment of the present invention.
Figure 2A:
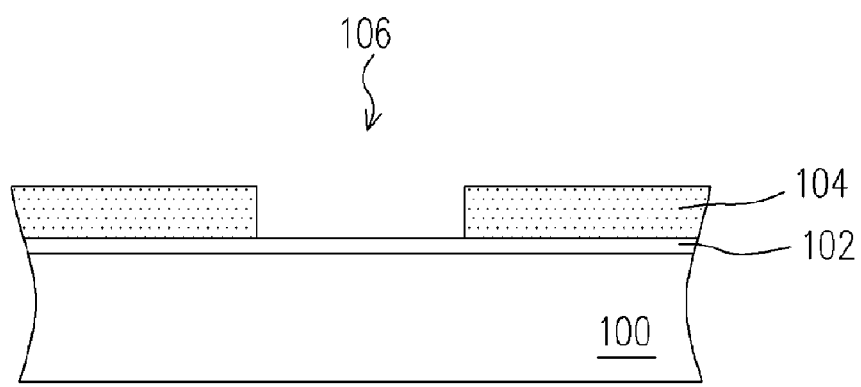
FIG. 2A~FIG. 2F are schematic cross-sectional views of a portion of a flash memory cell showing the steps for fabricating a flash memory according to the first embodiment.

Referring to FIG. 1A and FIG. 2A (FIG. 2A is cross-sectional view along line I—I of the FIG. 1A), a tunneling dielectric layer 102 is formed over a substrate 100 having a plurality of isolation structures 200. The tunneling dielectric layer 102 is, for example, a silicon oxide ($SiO_x$) layer and the thickness thereof may be 7.0 nm~9.5 nm. A patterned dielectric layer 104 having a trench 106 is formed over the tunneling dielectric layer 102. The patterned dielectric layer 104, for example, is made of materials having an etching selectivity different from the etching selectivity of conductive spacers formed sequentially. In addition, the patterned dielectric layer 104, for example, is made of dielectric materials having high dielectric constant. For instance, dielectric materials having high dielectric constant may be silicon nitride ($SiN_x$), silicon oxynitride ($SiO_xN_y$), SiC, $SiO_xC_y$, hafnium oxide ($HfO_2$), zirconium oxide ($ZrO_2$), titanium dioxide ($TiO_2$), cerium oxide ($CeO_2$), lanthanum oxide ($La_2O_3$) or aluminum oxide ($Al_2O_3$).

Figure 1B:
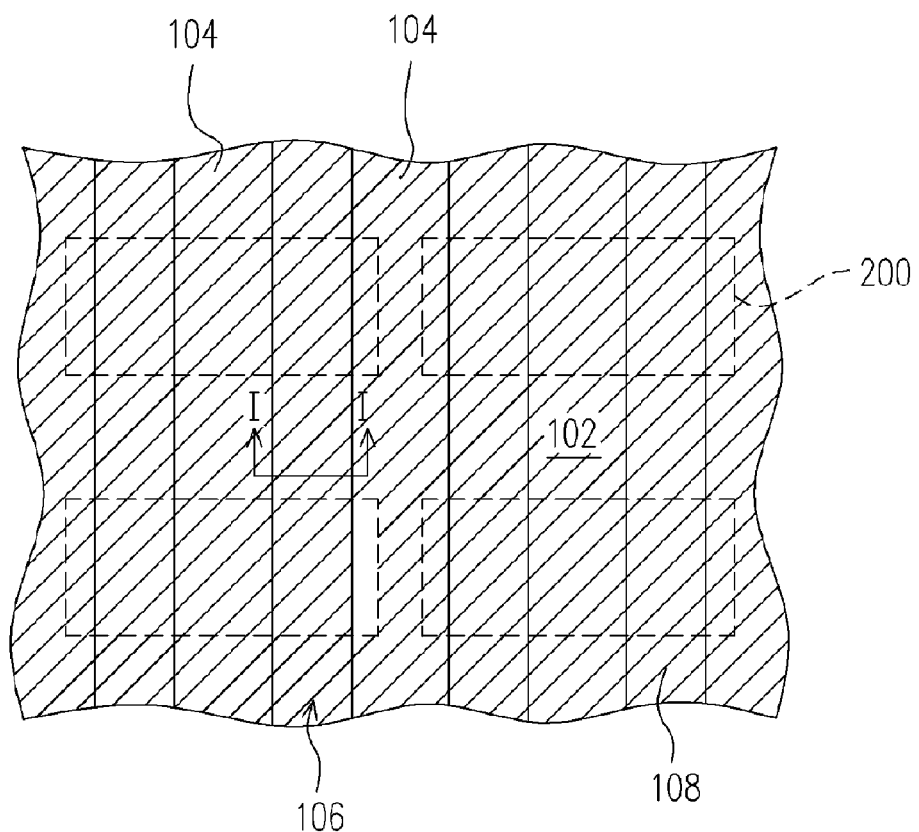
Figure 2B:
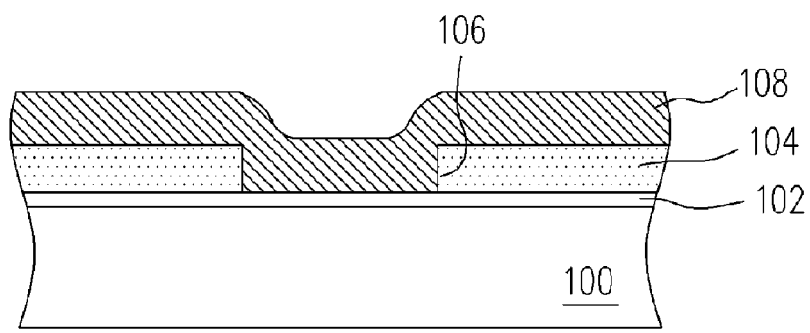

Referring to FIG. 1B and FIG. 2B (FIG. 2B is cross-sectional view along line I—I of the FIG. 1B), a conductive layer 108 is formed over the substrate 100 to cover the surface of the trench 106. The conductive layer 108 is, for example, a doped polysilicon layer and the thickness thereof may be 20 nm~60 nm. The preferred thickness of the conductive layer 108 is 40 nm.

Figure 1C:
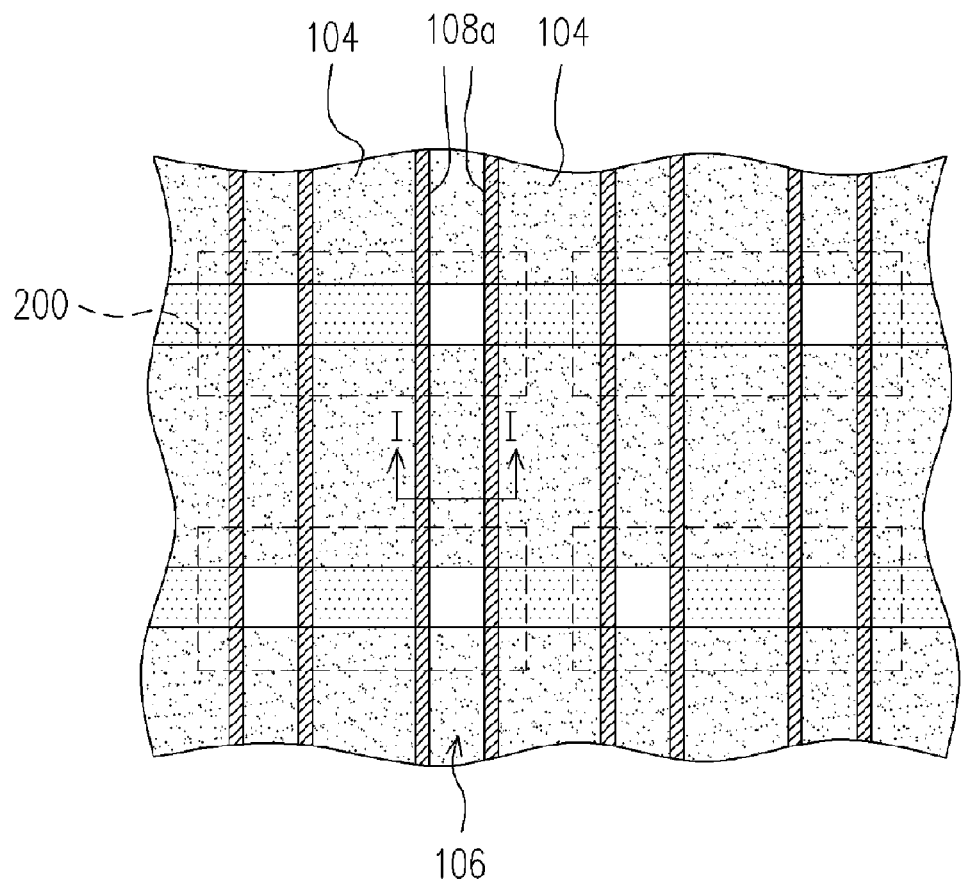
Figure 2C:
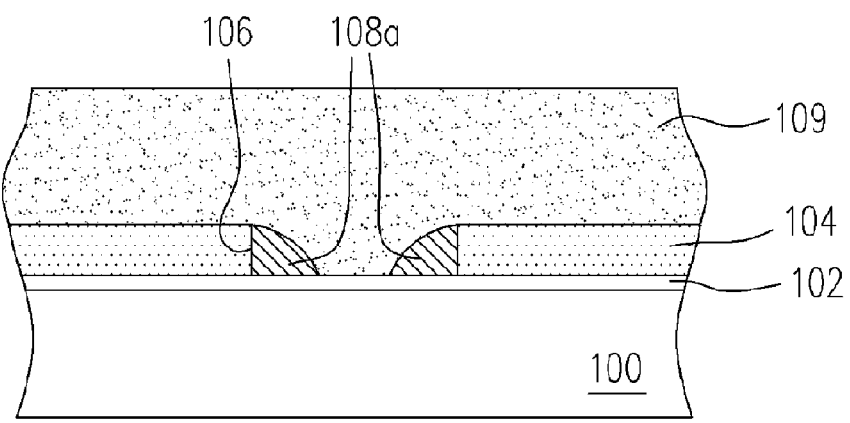

Referring to FIG. 1C and FIG. 2C (FIG. 2C is cross-sectional view along line I—I of FIG. 1C), portions of the conductive layer 108 (shown in FIG. 1B) is removed to form a pair of spacers 108a on sidewalls of the trench 106. The spacers 108a are formed by an etching-back process, for example. The distance between the spacers 108a formed in the same trench 160 is smaller than the resolution limit when the width of the trench 106 is equal to the minimum line width that current photolithography processes can achieve. The single-cell with two bits type of flash memory cell of the present invention and the conventional memory cell are identical in size. Furthermore, the flash memory cell of the present invention can be manufactured by using existing equipment and technique. Therefore, the costs of technical development and equipment investment are reduced significantly. In addition, after etching the conductive layer 108, an annealing process is performed at inert gas environment to eliminate the damage of the tunneling dielectric layer 102 caused by the etching-back process. A patterned photo-resist layer 109 is then formed over the substrate 100 and is used as a mask to define the conductive spacer 108a.

Figure 1D:
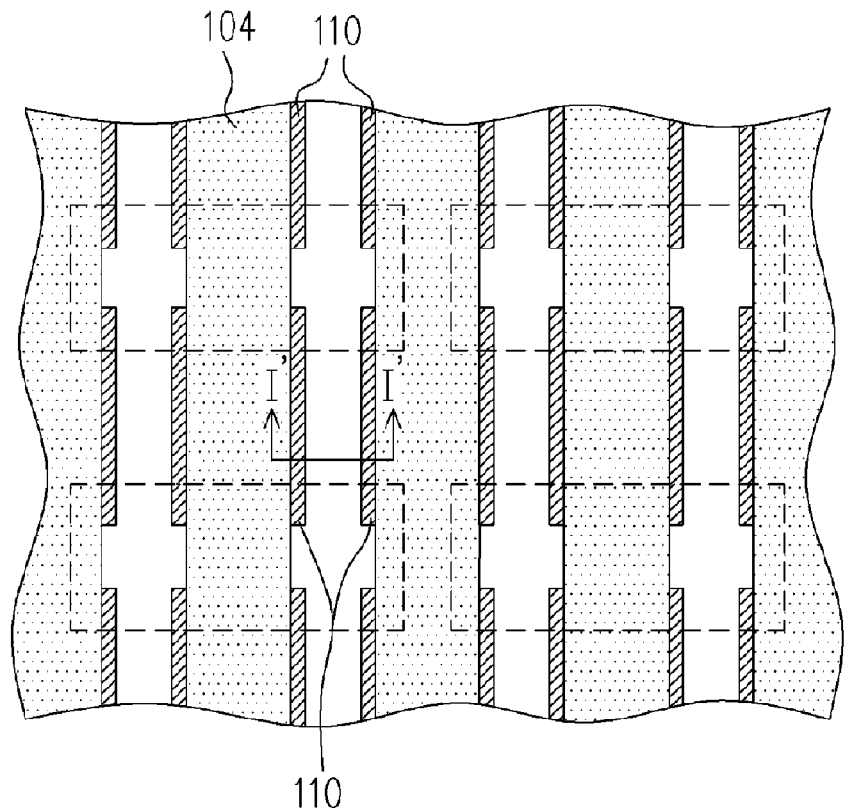
Figure 2D:
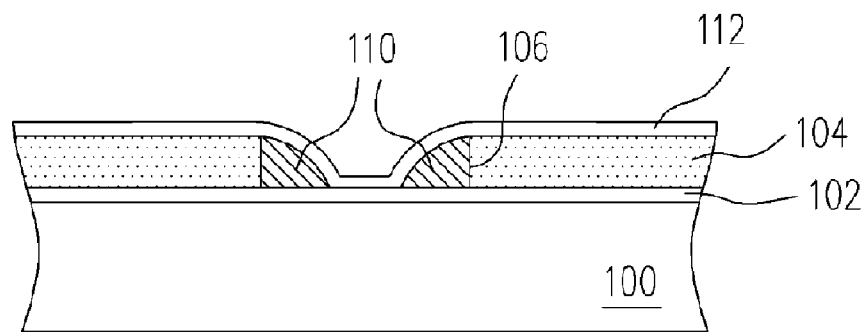

Referring to FIG. 1D and FIG. 2D (FIG. 2D is cross-sectional view along line I'—I' of FIG. 1D), by using the patterned photo-resist layer 109 (shown in FIG. 1C) as a mask, a plurality of floating gates 110 is formed by defining the conductive spacer 108a. Then, the patterned photo-resist layer 109 is removed to expose the patterned dielectric layer 104, the floating gates 110 and a portion of the tunneling dielectric layer 102. Thereafter, an inter-gate dielectric layer 112 is formed over the substrate 100 to cover the floating gates 110, the patterned dielectric layer 104 and a portion of the tunneling dielectric layer 102. The inter-gate dielectric layer 112 is, for example, a silicon oxide-silicon nitride-silicon oxide (ONO) layer or a silicon oxide-silicon nitride layer or a silicon oxide layer.

Figure 2E:
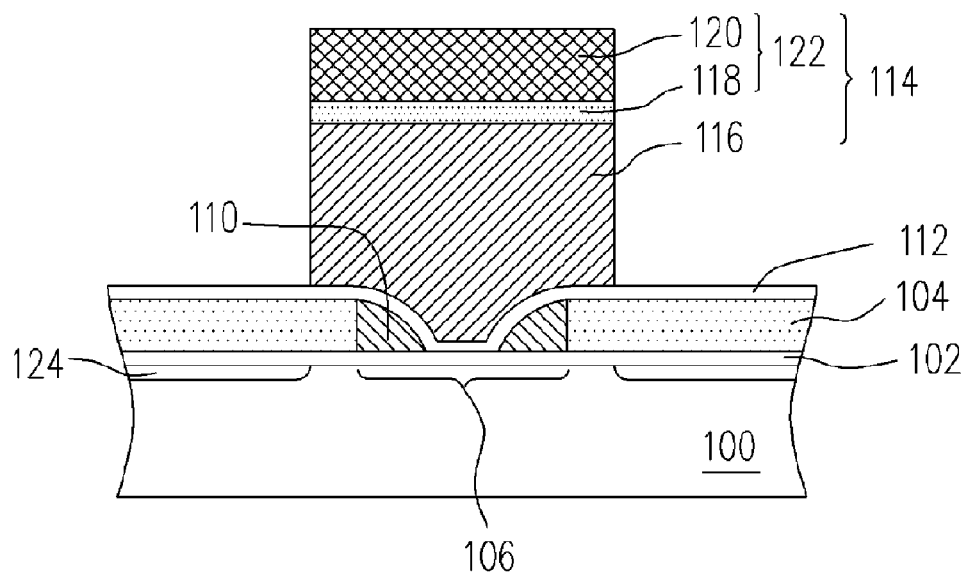

Referring FIG. 2E, a conductive structure 114 including a control gate is formed on the inter-gate dielectric layer 112. The conductive structure 114 can be formed by the following steps. First, a conductive layer (not shown) is formed on the inter-gate dielectric layer 112. Then, a capping layer including a silicon oxide layer and a silicon nitride layer is formed on the conductive layer. However, the composition of the capping layer is not limited. In this embodiment, the silicon oxide layer 118 is formed, for example, by tetra-ethyl-ortho-silicate (TEOS) as gas source. Thereafter, the silicon nitride layer, the silicon oxide layer and the conductive layer is patterned to form a plurality of control gates 116 and capping layers 122, wherein each capping layer 122 includes a silicon oxide layer 118 and a silicon nitride layer 120. In this embodiment, the material of the control gates 116 is, for example, doped polysilicon. As shown in FIG. 2E, the width of the conductive structure 114 is, for example, larger than or substantially identical with the width of the trench 106. Then, lightly doped drain region 124 can be formed in the substrate adjacent to the control gate 116. Dielectric spacers 126 are then formed on the sidewalls of the conductive structure 114 and a portion of the inter-gate dielectric layer 112 is exposed as shown in FIG. 2F.

Figure 2F:
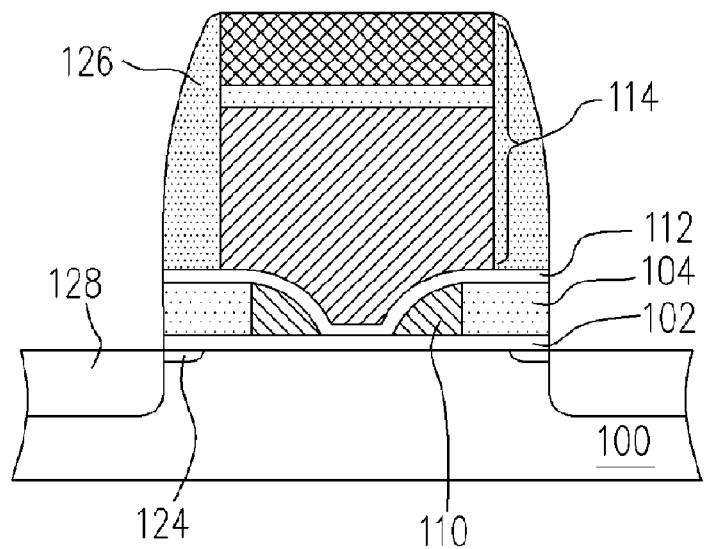

Referring to FIG. 2F, the exposed inter-gate dielectric layer 112 as well as the patterned dielectric layer 104 and the tunneling dielectric layer 102 underneath are removed. Then, source/drain regions 128 are formed in the substrate 100 at each side of the dielectric spacers 126, which is adjacent to the conductive structure 114.

In this embodiment, since two conductive spacers for charge trapping are formed in one flash memory cell, resolution limit of photolithography process is overcome so as to miniaturize an area occupied by a flash memory cell. The single-cell with two bits type of flash memory cell of this embodiment and the conventional memory cell are identical in size. Furthermore, the flash memory cell of this embodiment can be manufactured by using existing equipment and technique. As a result, the costs of technical development and equipment investment are reduced.

FIG. 3A~FIG. 3D are schematic cross-sectional views of a portion of a flash memory cell showing the steps for fabricating a flash memory according to the second embodiment of the present invention.

Figure 3A:
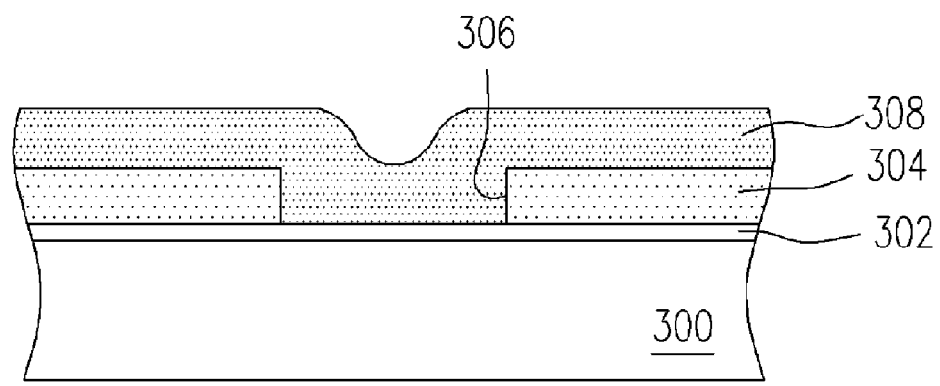
FIG. 3A~FIG. 3D are schematic cross-sectional views of a portion of a flash memory cell showing the steps for fabricating a flash memory according to the second embodiment of the present invention.
Figure 3B:
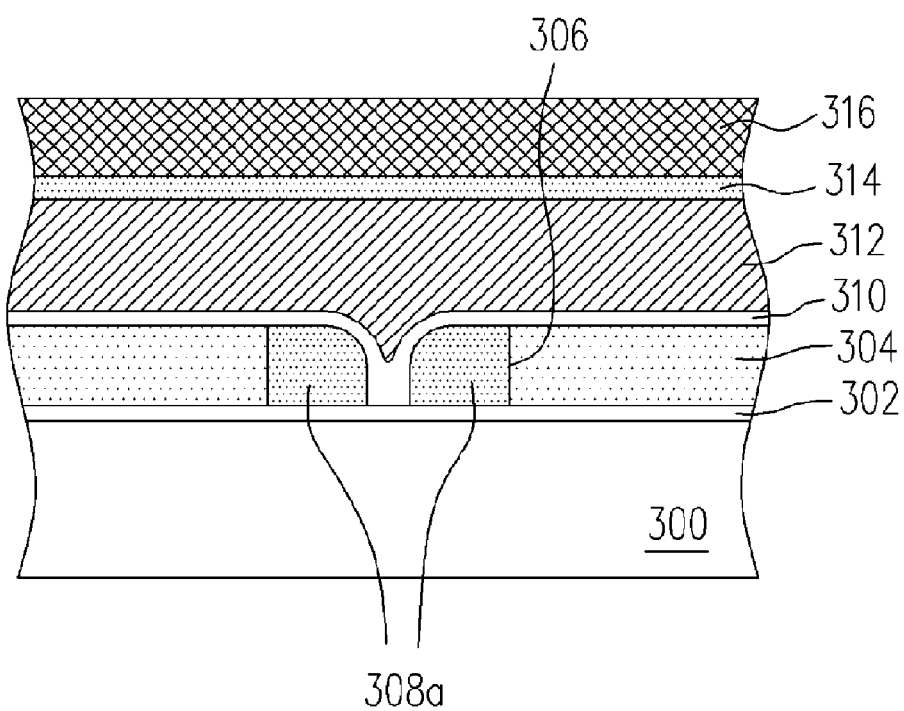

Referring to FIG. 3A, a pad oxide layer 302 is formed over a substrate 300. Then, a patterned dielectric layer 304 having a trench 306 is formed over the pad oxide layer 302. The patterned dielectric layer 304, for example, is made of materials having an etching selectivity different from the etching selectivity of charge-trapping layer formed sequentially. In addition, the patterned dielectric layer 304, for example, is made of dielectric materials, which is described in the first embodiment, having high dielectric constant. Then, a charge-trapping layer 308 is formed over the substrate 300 to cover the trench 306. In this embodiment, the charge-trapping layer 308 is, for example, a silicon nitride layer or a silicon oxynitride layer.

Referring to 3B, portions of the charge-trapping layer 308 is removed to form a pair of charge-trapping spacers 308a on the sidewalls of the trench 306. The charge-trapping spacers 308a are formed by an etching-back process. The distance between charge-trapping spacers 308a formed in the same trench 306 is smaller than resolution limit when the width of the trench 306 is equal to the minimum line width that current photolithography processes can achieve. A top oxide layer 310 is formed over the substrate to cover the charge-trapping spacers 308a, the patterned dielectric layer 304 and the pad oxide layer 302. Thereafter, a conductive layer 312 is formed on the top oxide layer 310. A capping layer including a silicon oxide layer 314 and a silicon nitride layer 316 is formed on the conductive layer 312. However, the composition of the capping layer is not limited to silicon oxide and silicon nitride.

Figure 3C:
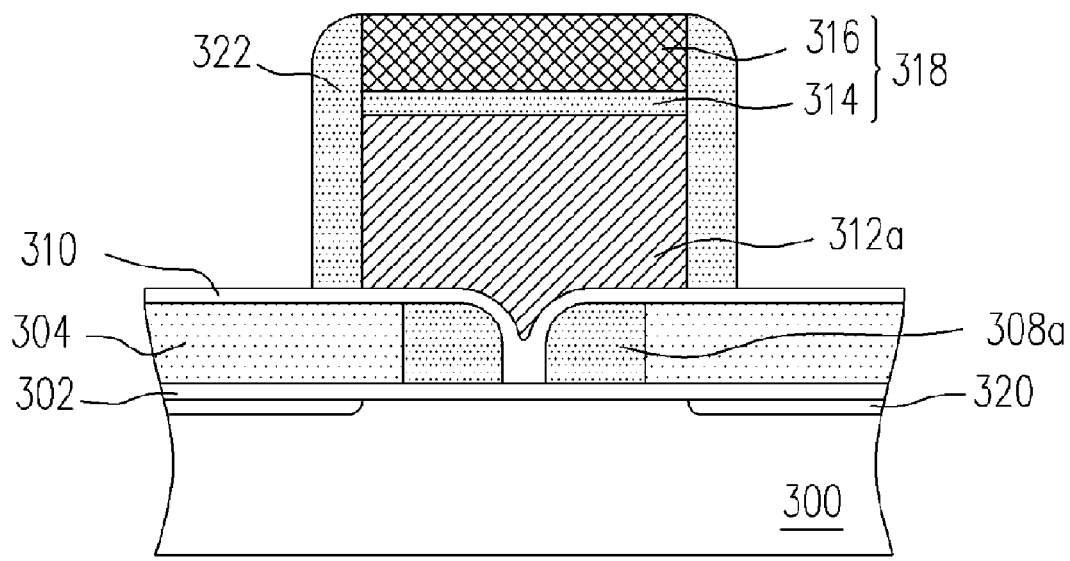

Referring to FIG. 3C, a capping layer 318 is formed by patterning the silicon oxide layer 314 and the silicon nitride layer 316. Then, the conductive layer 312 (shown in FIG. 3B) is patterned to form a gate 312a on the top oxide layer 310 over the charge-trapping spacers 308a. In this embodiment, the material of the gate 312a is, for example, doped polysilicon. As shown in FIG. 3C, the width of the gate 312a is, for example, larger than or substantially identical with the width of the trench 306. Thereafter, a lightly doped region 320 is formed in the substrate 300 adjacent to the gate 312a. A pair of dielectric spacers 322 are formed on the sidewalls of the gate 312a and the capping layer 318 to expose the top oxide layer 310 as shown in FIG. 3D.

Figure 3D:
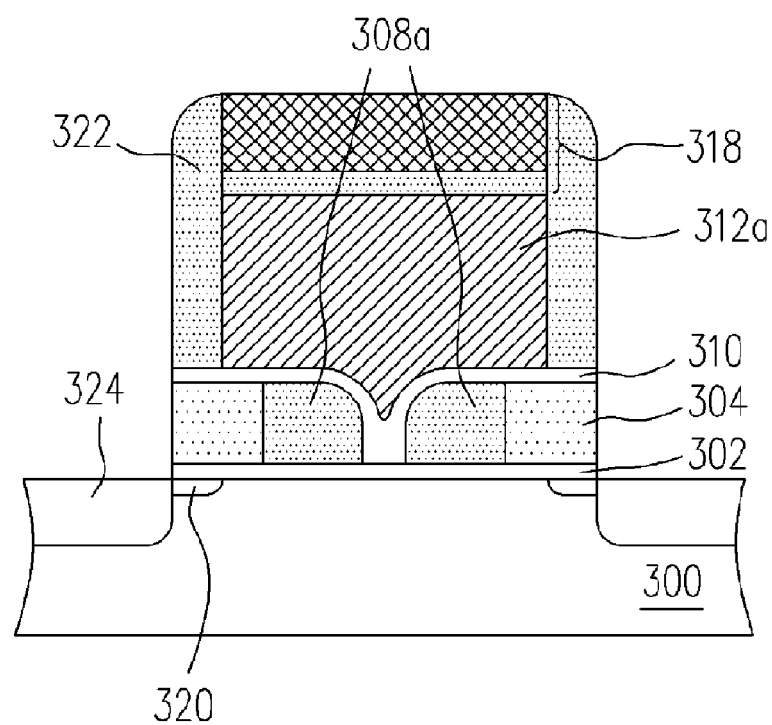

Referring to FIG. 3D, the exposed top oxide layer 310 as well as the patterned dielectric layer 304 and the pad oxide layer 302 underneath are removed. Ultimately, source/drain regions 324 are formed in the substrate 300 adjacent to the gate 312a and the dielectric spacers 322.

As described above, the present invention at least provides the following advantages.

1. Since the present invention utilizes spacers as the charge storage structure, the single-cell with two bits type of memory cell of the present invention and a conventional memory cell can be identical in size.

2. The flash memory cell of the present invention can be manufactured by using current equipment and technique. Therefore, the costs of technical development and equipment investment are reduced significantly.

3. The SONOS memory cell of the present invention can prevent a programming error caused by electrons transferring from one side to the other side in a charge-trapping layer. Therefore, miniaturization of a SONOS memory cell is practicable.

The foregoing description of the preferred embodiment of the present invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method of manufacturing a non-volatile memory cell, comprising:
    forming a first dielectric layer over a substrate;
    forming a second dielectric layer having a trench over the first dielectric layer;
    forming a pair of charge storage spacers on sidewalls of the trench;
    forming a third dielectric layer over the substrate to cover the first dielectric layer, the charge storage spacers and the second dielectric layer;
    forming a conductive structure on a position over the charge starage spacers on the third dielectric layer;
    forming a pair of dielectric spacers on sidewalls of the conductive structure;
    removing portions of the third dielectric layer, the second dielectric layer and first dielectric layer not covered by the conductive structure; and
    forming source/drain regions in the substrate at each side of the conductive structure.

2. The method of claim 1, wherein the first dielectric layer comprises a silicon oxide layer.

3. The method of claim 1, wherein forming the pair of charge storage spacers on the sidewalls of the trench comprises:
    forming a charge storage material layer over the substrate; and
    etching back the charge storage material layer.

4. The method of claim 3, wherein an etching selectivity of the charge storage material layer has different etching selectivity from the second dielectric layer.

5. The method of claim 3, wherein the charge storage material layer is a silicon nitride layer or a silicon oxynitride layer.

6. The method of claim 3, wherein the charge storage material layer comprises a doped polysilicon layer.

7. The method of claim 3, further comprising a step of performing an annealing process after etching back the charge storage material layer so as to eliminate damage of the charge storage material layer caused by the etching-back process.

8. The method of claim 1, wherein the third dielectric layer is a silicon oxide-silicon nitride-silicon oxide layer or a silicon oxide-silicon nitride layer or a silicon oxide layer.

9. A method of manufacturing a flash memory cell, comprising:
   forming a tunneling dielectric layer over a substrate;
   forming a patterned dielectric layer having a trench over the tunneling dielectric layer;
   forming a conductive layer over the substrate to cover a surface of the trench;
   removing portions of the conductive layer to form a pair of conductive spacers on sidewalls of the trench;
   forming an inter-gate dielectric layer over the substrate to cover the patterned dielectric layer, the pair of the conductive spacers and the tunneling dielectric layer;
   forming a control gate over the conductive spacers on the inter-gate dielectric layer;
   forming a pair of dielectric spacers on sidewalls of the control gate, wherein a portion of the inter-gate dielectric layer is exposed;
   removing the exposed inter-gate dielectric layer the patterned dielectric layer and the tunneling dielectric layer; and
   forming source/drain regions in the substrate at each side of the control gate.

10. The method of claim 9, wherein the tunneling dielectric layer comprises a silicon oxide layer.

11. The method of claim 9, further comprising a step of performing an annealing process after removing portions of the conductive layer.

12. The method of claim 9, wherein the inter-gate dielectric layer is a silicon oxide-silicon nitride-silicon oxide layer or a silicon oxide-silicon nitride layer or a silicon oxide layer.

13. A method of manufacturing a silicon-oxide-nitride-oxide-silicon (SONOS) memory cell, comprising:
    forming a pad oxide layer over a substrate;
    forming a patterned dielectric layer having a trench over the pad oxide layer;
    forming a charge-trapping layer over the substrate to cover the trench;
    removing portions of the charge-trapping layer to form a pair of charge-trapping spacers on sidewalls of the trench;
    forming a top oxide layer over the substrate to cover the surface of the patterned dielectric layer, the pair of the charge-trapping spacers and the pad oxide layer;
    forming a gate on the top oxide layer over the charge-trapping spacers;
    forming a pair of dielectric spacers on sidewalls of the gate, wherein a portion of the top oxide layer is exposed;
    removing the exposed top oxide layer, the patterned dielectric layer and the pad oxide layer underneath; and
    forming a source/drain region in the substrate at each side of the gate.

14. The method of claim 13, wherein an etching selectivity of the patterned dielectric layer is different from an etching selectivity of the charge-trapping layer.

15. The method of claim 13, wherein the charge-trapping layer is a silicon nitride layer or a silicon oxynitride layer.

* * * * *